(12) United States Patent
Parvarandeh et al.

(10) Patent No.: US 8,906,720 B1
(45) Date of Patent: Dec. 9, 2014

(54) DEVICE HAVING AN OPTICAL ELEMENT AND AN AMBIENT LIGHT SENSOR INTEGRATED ON A SINGLE SUBSTRATE AND A PROCESS FOR MAKING SAME

(71) Applicant: Maxim Integrated Products, Inc., San Jose, CA (US)

(72) Inventors: Pirooz Parvarandeh, Los Altos Hills, CA (US); Christopher F. Edwards, Sunnyvale, CA (US); Joy T. Jones, Fremont, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/775,695

(22) Filed: Feb. 25, 2013

(51) Int. Cl.
H01L 21/00 (2006.01)
H01L 33/00 (2010.01)

(52) U.S. Cl.
USPC .............................................. 438/31; 257/98

(58) Field of Classification Search
USPC .................... 438/22, 31, 39–43; 257/79, 98, 257/E33.001–E33.077
See application file for complete search history.

(56) References Cited

U.S. PATENT DOCUMENTS

| 6,661,578 | B2 * | 12/2003 | Hedrick | 359/620 |
| 7,705,465 | B2 * | 4/2010 | Kimura et al. | 257/774 |
| 8,169,011 | B2 * | 5/2012 | Oh | 257/292 |
| 2010/0149396 | A1 * | 6/2010 | Summa et al. | 348/311 |

* cited by examiner

Primary Examiner — Calvin Lee
(74) Attorney, Agent, or Firm — Advent, LLP

(57) ABSTRACT

A device having one or more optical elements and an ambient light sensor integrated on a single substrate (e.g., wafer) and a method (e.g., process) for making same is described herein. The process includes the step of forming the ambient light sensor on a first surface of the substrate. The process further includes the step of forming a plurality of recesses in a second surface of the substrate, the second surface being located opposite the first surface. The process further includes depositing silicon dioxide into the plurality of recesses. The process further includes etching a pattern into the silicon dioxide (e.g., glass) to form the optical elements.

20 Claims, 7 Drawing Sheets

DEVICE HAVING AN OPTICAL ELEMENT AND AN AMBIENT LIGHT SENSOR INTEGRATED ON A SINGLE SUBSTRATE AND A PROCESS FOR MAKING SAME

BACKGROUND

Ambient light sensors are currently implemented in a variety of electronic devices. For example, ambient light sensors are implemented in hand-held electronic devices, such as personal digital assistants (PDAs), mobile phones and notebook computers, for automatically adjusting the brightness of the backlight of the display (e.g., liquid crystal display (LCD) panel) of the device based upon the surrounding light level. For instance, the ambient light sensor (ALS) increases the brightness of the display's backlight when the device is being used in a brightly lit area and decreases the brightness of the display's backlight when the device is being used in a dimly lit area. This improves the user experience by making the display easier to see. Further, the ALS may automatically adjust the brightness of the display's backlight based upon the proximity of a user to the device. This promotes power savings for the device, thereby extending the life of the battery of the device.

SUMMARY

A device having one or more optical elements and an ambient light sensor integrated on a single substrate (e.g., wafer) and a method (e.g., process) for making same is described herein. The process includes the step of forming the ambient light sensor on a first surface of the substrate. The process further includes the step of forming a plurality of recesses in a second surface of the substrate, the second surface being located opposite the first surface. The process further includes depositing silicon dioxide into the plurality of recesses. The process further includes etching a pattern into the silicon dioxide (e.g., glass) to form the optical elements.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

A number of currently available products integrate an ambient light sensor (ALS) and an optical element. Fabrication processes for making these currently available products include the steps of fabricating a first wafer (which includes the ALS), fabricating a second wafer (which includes the optical element) and bonding the first and second wafers together to form the final product. There are numerous drawbacks to these currently available products and the fabrication processes for making them.

Described herein is a device having an integrated optical element and ambient light sensor and a method for producing the device which obviates at least some of the above-referenced drawbacks associated with the currently available integrated ALS and optical element products and the processes for making the currently available integrated ALS and optical element products.

Example Fabrication Processes and Implementations

Figure 1:
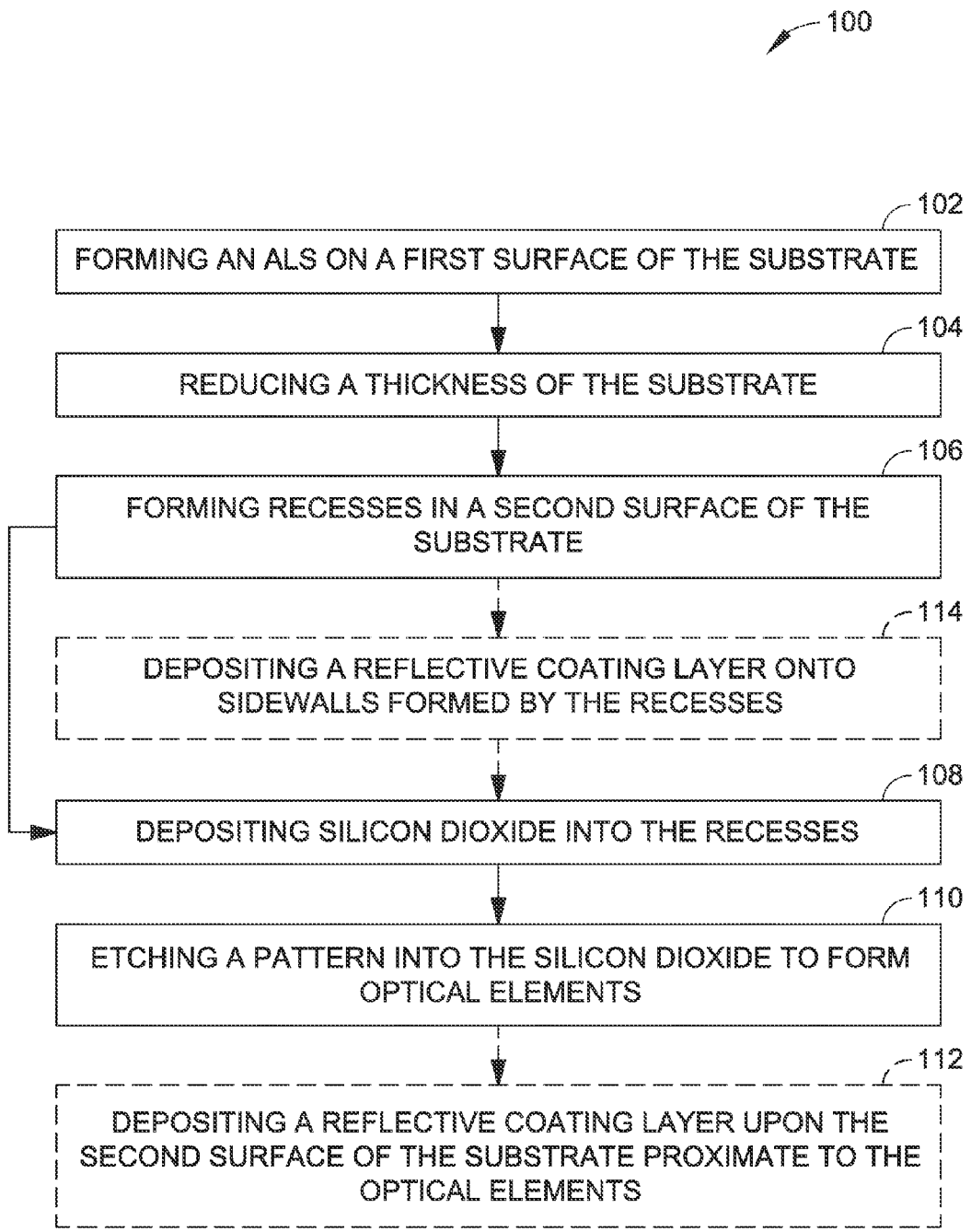
FIG. 1 depicts a flow diagram illustrating an example process for fabricating a device having an optical element and an ambient light sensor integrated on a single substrate in accordance with an exemplary embodiment of the present disclosure.
Figure 2:
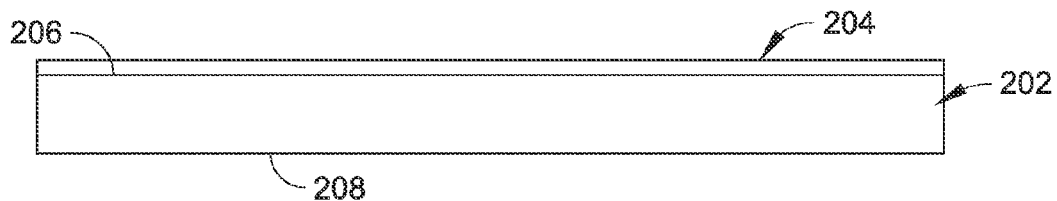
FIG. 2 is a cross-sectional view of an ambient light sensor (ALS) formed on a substrate in accordance with an exemplary embodiment of the present disclosure.

FIG. 1 (FIG. 1) depicts a flowchart illustrating an example process (e.g., method) for fabricating a device having an optical element and an ambient light sensor integrated on a single substrate in accordance with an exemplary embodiment of the present disclosure. In embodiments, the method 100 includes the step of forming an ambient light sensor (ALS) on a first surface of the substrate (Step 102). FIG. 2 (FIG. 2) is a depiction of the substrate 202 and the ALS 204 formed on the substrate 202 in accordance with an exemplary embodiment of the present disclosure. In embodiments, the substrate 202 is a wafer (e.g., integrated circuit chip). For example, the wafer 202 is formed of semiconductor material (e.g., silicon, gallium arsenide) and is suitable for use in the fabrication of integrated circuits and/or other microelectronic devices. In embodiments, the substrate 202 (e.g., wafer) can have one or more integrated circuits formed therein. In various implementations, the integrated circuits can comprise digital integrated circuits, analog integrated circuits, mixed signal integrated circuits, combinations thereof, and so forth. The integrated circuits can be formed through suitable front-end-of-line (FEOL) fabrication techniques. In embodiments, the substrate 202 includes FEOL and necessary interconnect circuitry for configuring the device for use within electronic devices, (e.g., mobile phones, notebook computers, personal digital assistants (PDAs), etc.), such that the device is communicatively coupled with other components of the electronic device(s).

In embodiments, the ALS 204 is a photo detector (e.g., a photodiode) which is configured for sensing (e.g., detecting) light and converting the detected light into a voltage or current (depending on the mode of operation). In embodiments, the ALS 204 is a p-n junction (e.g., a p-n photodiode). In other embodiments, the ALS 204 is a PIN structure (e.g., a PIN photodiode). In embodiments, the ALS 204 has a spectral response ranging from four hundred nanometers (400 nm) to seven hundred nanometers (700 nm), with a peak sensitivity at about five hundred-sixty nanometers (560 nm). In embodiments, the ALS 204 is formed on a first surface (e.g., a front or top surface) 206 of the substrate 202. In embodiments, the ALS 204 formed on the substrate 202 includes active circuitry for providing an active surface for the substrate 202. For example, the active surface can be defined as a surface where electronic action of the device having the integrated optical element and ambient light sensor device occurs.

Figure 3:
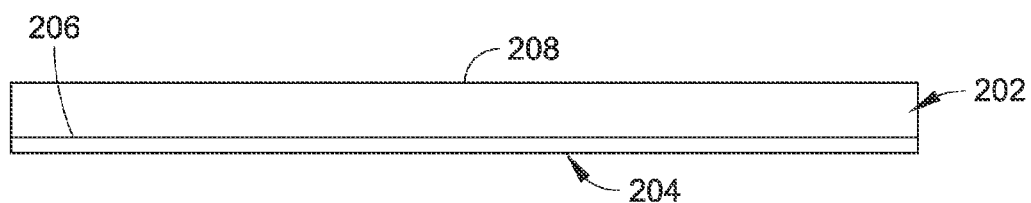
FIG. 3 is an inverted cross-sectional view of the structure shown in FIG. 2, wherein the substrate of the structure has been subjected to a thickness reduction step (e.g., wafer thinning) in accordance with an exemplary embodiment of the present disclosure.

In embodiments, the method 100 includes a step of reducing a thickness of the substrate (Step 104). In embodiments, the substrate (e.g., wafer) 202 is subjected to a grinding process for reducing the thickness of (e.g., removing layers of) the substrate. In embodiments, the grinding process includes mechanical backgrinding and polishing of the substrate 202. For instance, a 2-step grinding process (e.g., a coarse grind, followed by a fine grind) can be implemented for reducing the thickness of (e.g., thinning) the substrate 202. FIG. 3 (FIG. 3) is a depiction of the substrate 202 including the ALS 204, after the substrate 202 has been subjected to the thickness reduction step. In other embodiments, etching processes, such as those used in microfabrication for chemically removing layers from the surface of a semiconductor wafer during manufacturing, are implemented for reducing the thickness of the substrate 202. For example, chemical etching processes, such as liquid (e.g., wet) or plasma (e.g., dry) etching processes can be implemented for reducing the thickness of the substrate 202 when an ultra-thin (e.g., approximately fifty micrometers thick) substrate is desired. In further embodiments, a combination of mechanical backgrinding and chemical etching processes are implemented for reducing the thickness of the substrate 202. In embodiments, when reducing the thickness of the substrate 202, such as via the grinding or etching processes discussed above, the process(es) is/are applied to a second surface (e.g., a back or bottom surface) 208 of the substrate 202, the second surface 208 being located generally opposite (e.g., on an opposite side of the substrate from) the first surface 206. In embodiments, prior to the thickness reducing step, the thickness of the substrate 202 can be approximately seven hundred-fifty micrometers (750 um). In embodiments, after the thickness reducing step, the thickness of the substrate 202 can range from about fifty micrometers (50 um) to about seventy-five micrometers (75 um). In embodiments where a backgrinding process is implemented for reducing the thickness of the substrate (e.g., wafer) 202, prior to grinding, the substrate (e.g., wafer) 202 can be laminated with an ultraviolet (UV) curable backgrinding tape to ensure against wafer surface damage (due to backgrinding) and to prevent wafer surface contamination (due to infiltration of grinding fluid and/or debris).

Figure 4:
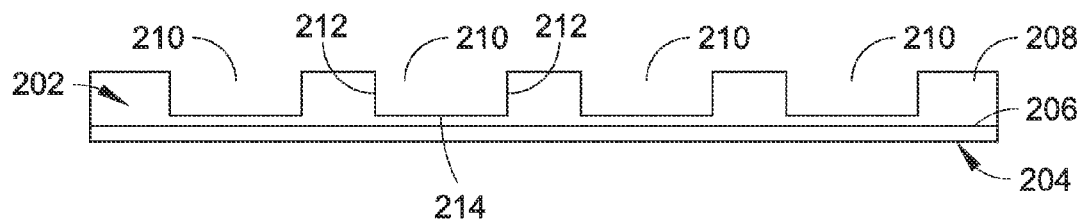
FIG. 4 is a cross-sectional view of the structure shown in FIG. 3, the structure further including a pattern of recesses formed in the substrate in accordance with an exemplary embodiment of the present disclosure.

In embodiments, the method 100 includes a step of forming a plurality of recesses (e.g., indents, cavities) in a second surface of the substrate (Step 106). In embodiments, the plurality of recesses are formed in accordance with a pre-determined pattern. FIG. 4 (FIG. 4) is a depiction of the substrate 202 after the pattern of recesses 210 has been formed in the substrate 202. In embodiments, the recesses 210 are formed in the second surface (e.g., back surface) 208 of the substrate 202 and extend in a generally vertical direction within the substrate 202 towards the first surface 206 of the substrate 202. In embodiments, each of the recesses 210 is bounded by one or more sidewalls 212 and a floor 214. In embodiments, the plurality of recesses is formed via photolithography and chemical etching processes. For example, a photoresist can be applied to the second surface 208 of the substrate 202, the photoresist having the pre-determined pattern formed on it. The pattern is then exposed to light (e.g., UV light), followed by the second surface 208 of the substrate 202 being etched to form the plurality of recesses 210. In embodiments, the recesses 210 are formed by a chemical etching process, such as a liquid (wet) or plasma (dry) etching process. For example, etching processes such as a deep reactive-ion etching (DRIE) process or a potassium hydroxide (KOH) etching process can be implemented. In embodiments, the etching process for forming the plurality of recesses 210 is selected based upon the desired shape of the recesses. For example, the DRIE process can be implemented when rectangular recesses (e.g., recesses with truly vertical sidewalls) are desired (such as the sidewalls 212 shown in FIG. 4), or the KOH etching process can be implemented when recesses with sloped (e.g., angled) sidewalls (e.g., trapezoidal recesses) are desired. In embodiments, the DRIE process and the KOH etching process are implemented in combination for providing recesses 210 having shapes which are a combination of a rectangular and trapezoidal shapes. As mentioned above, the recesses 210 extend towards the first surface 206 of the substrate 202. In embodiments, the recesses 210 are formed so that they approach, but do not physically contact, the ALS 204 (e.g., the active surface), as shown in FIG. 4. In alternative embodiments, if the substrate (e.g., wafer) 202 is a silicon on insulator (SOI) wafer, the recesses 210 would be formed such that the floors (e.g., bottoms) 214 of the recesses would stop at the oxide interface.

Figure 5:
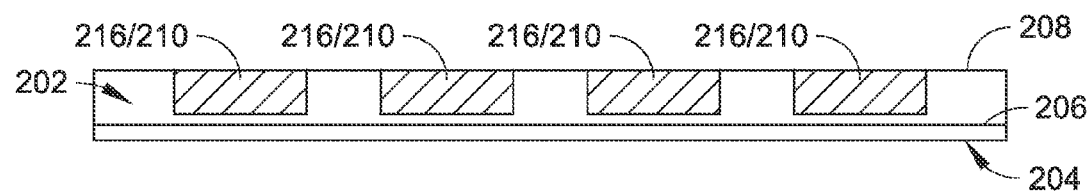
FIG. 5 is a cross-sectional view of the structure shown in FIG. 4, the structure further including glass formed within the recesses in accordance with an exemplary embodiment of the present disclosure.

In embodiments, the method 100 includes a step of depositing silicon dioxide ($SiO_2$) into the recesses (Step 108). In embodiments, the deposited silicon dioxide forms glass 216. FIG. 5 (FIG. 5) is a depiction of the substrate 202 after the silicon dioxide 216 has been deposited within the recesses 210 and has formed glass 216. In embodiments, the silicon dioxide 216 is deposited into the recesses 210 via a chemical vapor deposition (CVD) process. For example, the recesses can be completely filled such that a surface (e.g., top surface) 218 of the silicon dioxide (e.g., glass) 216 is co-planar with (e.g. located at) the second (e.g., bottom, back) surface 208 of the substrate 202.

Figure 6:
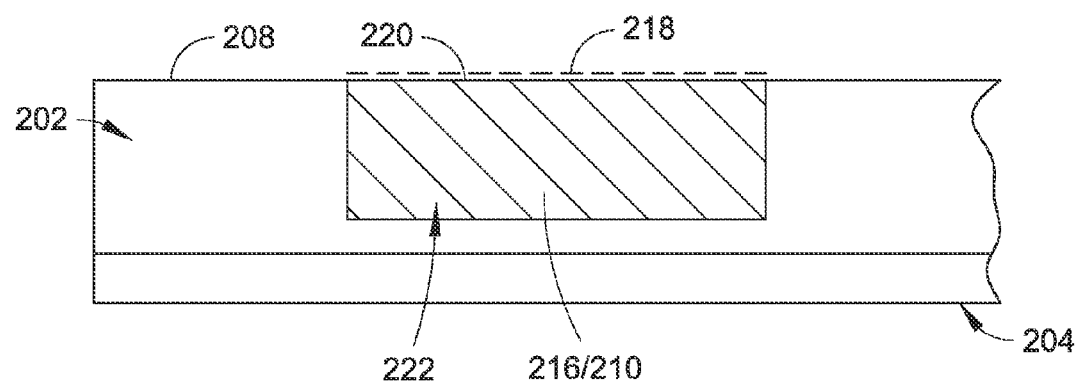
FIG. 6 is a close-up, partial cross-sectional view of one of the recesses of the structure shown in FIG. 5, wherein the structure further includes an optical element formed by a pattern etched into the glass in accordance with an exemplary embodiment of the present disclosure.

In embodiments, the method 100 includes a step of etching a pattern(s) into the silicon dioxide to form a plurality of optical elements (Step 110). FIG. 6 (FIG. 6) is a close-up depiction of one of the recesses 210 of the substrate 202, the depiction showing the pattern 218 etched into a surface (e.g., top surface) 220 of the silicon dioxide (e.g., glass) in the recess 210 to form an optical element 222. In embodiments, a pattern can be etched into the surface (e.g., top surface) 220 of the silicon dioxide (e.g., glass) 216 in each of the recesses 210 to form the optical elements 222. In embodiments, the pattern can be etched into the glass 216 to form the optical elements 222 using photolithography and chemical etching processes, such as those described above. In embodiments, the optical elements 222 are diffractive optical elements. In embodiments, the optical elements 222 are lenses. For example, the lenses 222 can be Fresnel lenses, ball lenses, micro lenses or other similar optical elements. In one or more embodiments, the pattern(s) 218 etched into the surface 220 of the silicon dioxide (e.g., glass) 216 is a Fresnel lens pattern (e.g., a pattern for creating a Fresnel lens).

Figure 7:
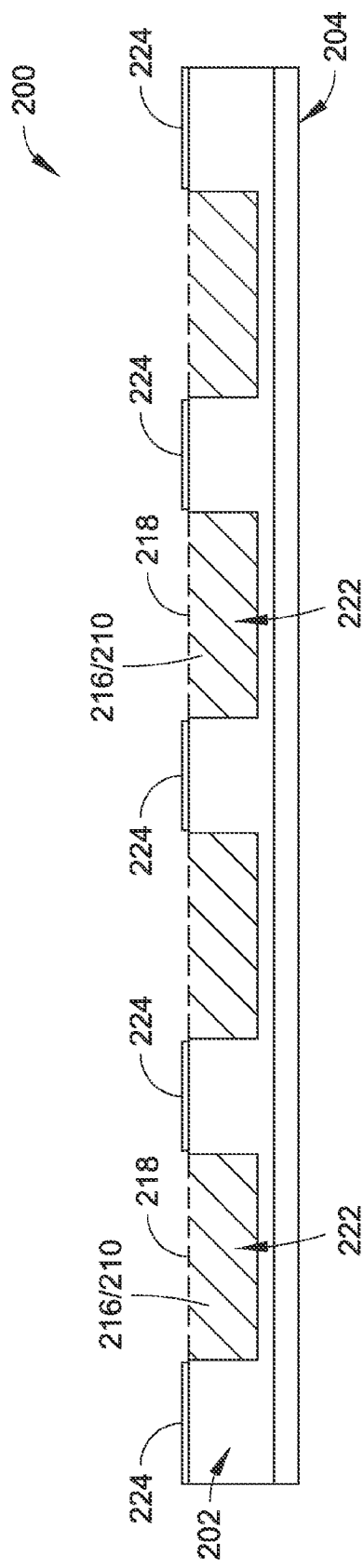
FIG. 7 is a cross-sectional view of a device formed by the process depicted in FIG. 1, the device implementing metal shielding proximal to the optical elements for shielding underlying circuitry of the device from incident light in accordance with an exemplary embodiment of the present disclosure.

In at least one embodiment, the method 100 can include a step of depositing a reflective coating layer upon the second surface of the substrate in a non-overlapping (e.g., non-obstructing) orientation relative to the plurality of optical elements (Step 112). FIG. 7 is a depiction of the substrate 202 after the reflective coating layer 224 has been deposited upon the second surface 208 of the substrate 202. In embodiments, the reflective coating layer 224 is deposited upon the second surface 208, such that it is adjacent to (e.g., is formed around, is located proximate to, does not overlap, does not cover, does not totally or partially obscure) any of the optical elements 222. In embodiments, the reflective coating layer 224 is configured for providing at least some shielding for underlying circuitry of the device 200 from light (e.g., incident light). In embodiments, the reflective coating of the reflecting coating layer 224 can be an opaque material or a metal. In embodiments, the above-described configuration of the device 200 allows for light (e.g., incident light) to enter the device 200 from the second (e.g., bottom, back) surface 208 of the substrate 202.

In embodiments, the device 200 resulting from (e.g., fabricated by) the steps of the method 100 described above is shown in FIG. 7. The above-described method 100 results in the formation of device 200 in which the ALS 204 and the optical elements 222 are integrated on a single substrate (e.g., wafer) 202. Because of this, the fabrication processes described herein for producing the device 200 do not include a step of fabricating two separate wafers, or a wafer-to-wafer bonding step, thereby promoting low manufacturing costs, low reject rates, reliability, robustness and excellent performance. Further, because the device 200 includes a single substrate (e.g., wafer) 202 rather than multiple substrates (e.g., wafers), when the device 200 is implemented within electronic devices (e.g., mobile phones, notebook computers, personal digital assistants (PDAs), etc.), the device 200 allows those electronic devices to be configured as thin (e.g., low-profile) electronic devices.

Figure 8:
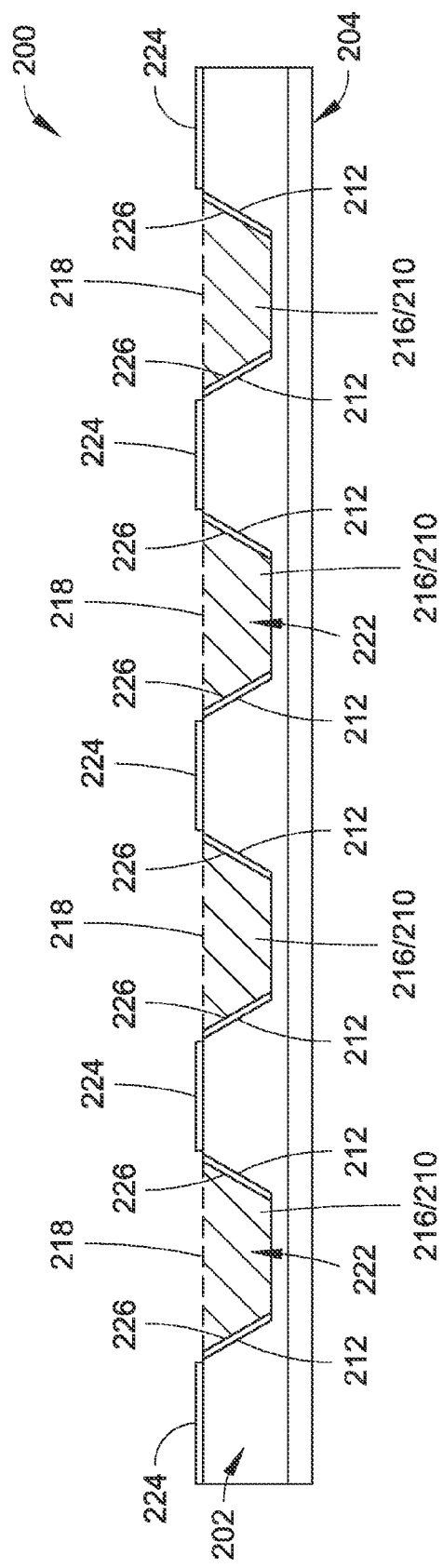
FIG. 8 is a cross-sectional view of a device formed by the process depicted in FIG. 1 in which the sidewalls formed by the recesses are sloped in accordance with a further exemplary embodiment of the present disclosure.

FIG. 8 (FIG. 8) depicts an embodiment of the device 200 in which the sidewalls 212 formed by the recesses 210 are sloped sidewalls. In embodiments where the sidewalls 212 formed by the recesses 210 are sloped, the method 100 can include a step of, prior to depositing silicon dioxide into the recesses, depositing a reflective coating layer onto sidewalls formed by the recesses (Step 114). In embodiments, the additional reflective coating layer 226 is configured for providing a further degree of protection (e.g., shielding) for underlying circuitry of the device 200 from light (e.g., incident light). In embodiments, the reflective coating of the additional reflecting coating layer 226 can be an opaque material or a metal. As mentioned above, an etching process, such as a KOH etching process, can be implemented during the recess formation step to form recesses which have sloping sidewalls.

Figure 9:
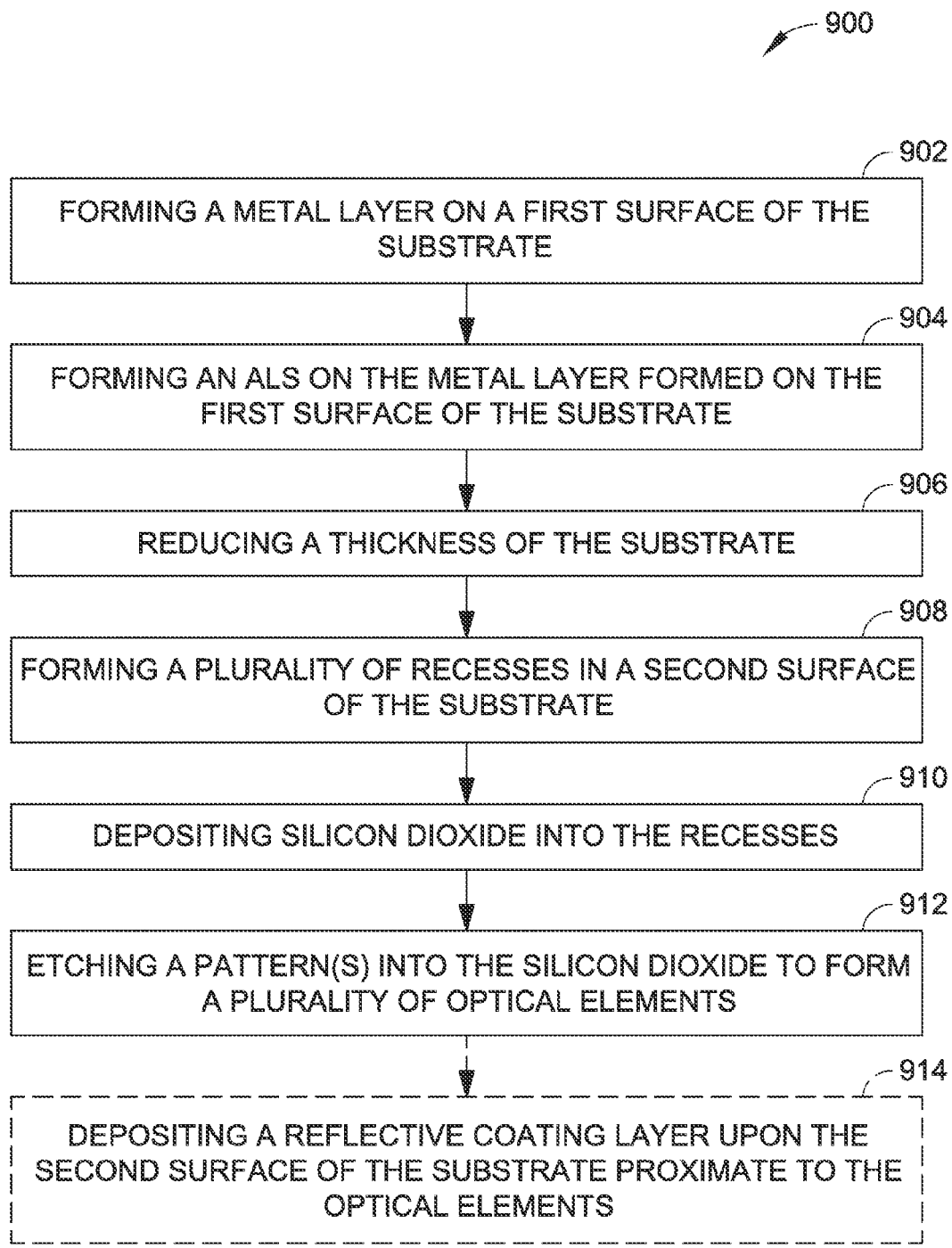
FIG. 9 depicts a flow diagram illustrating an example process for fabricating a device having an optical element and an ambient light sensor integrated on a single substrate, the device further including a metal 1 (M1) mirror in accordance with a further exemplary embodiment of the present disclosure.
Figure 10:
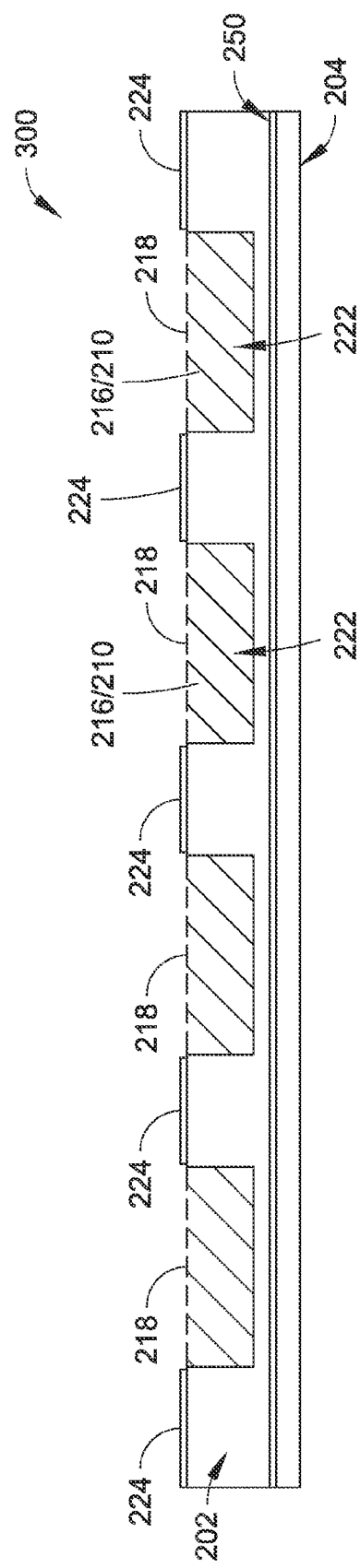
FIG. 10 is a cross-sectional view of the device formed by the process depicted in FIG. 9 in accordance with an exemplary embodiment of the present disclosure.

FIG. 9 (FIG. 9) depicts a flowchart illustrating an example process (e.g., method) for fabricating a device having an optical element and an ambient light sensor integrated on a single substrate in accordance with a further exemplary embodiment of the present disclosure. FIG. 10 (FIG. 10) is a depiction of the device 300 resulting from the fabrication process illustrated in FIG. 10 and described below.

In embodiments, the method 900 includes a step of forming a metal layer on a first surface of the substrate (Step 902). In embodiments, the metal layer 250 is formed on the first surface 206 of the substrate 202. For example, the metal layer 250 can be configured as a sheet of metal (e.g., metal 1 (M1)), such that the metal layer 250 forms a mirror (e.g., an M1 mirror, an M1 mirror interface) 250.

In embodiments, the method 900 includes a step of forming an ambient light sensor (ALS) on the metal layer formed on the first surface of the substrate (Step 904). In embodiments, the ALS 204 is formed on the metal layer 250.

In embodiments, the method 900 includes a step of reducing a thickness of the substrate (Step 906). In embodiments, any one of a number of various processes (e.g., grinding processes, etching processes) as described above can be implemented for reducing the thickness of the substrate 202. In embodiments, the processes implemented for reducing the thickness of the substrate are applied to the second surface 208 of the substrate 202.

In embodiments, the method 900 includes a step of forming a plurality of recesses in a second surface of the substrate (Step 908). In embodiments, the recesses 210 are formed in the second surface 208 of the substrate 202 as described above.

In embodiments, the method 900 includes a step of depositing silicon dioxide into the recesses (Step 910). In embodiments, the silicon dioxide 216 is deposited into the recesses 210 as described above and forms glass 216.

In embodiments, the method 900 includes a step of etching a pattern(s) into the silicon dioxide to form a plurality of optical elements (Step 912). In embodiments, a pattern is etched into the top surface 220 of the silicon dioxide (e.g., glass) 216 in each of the recesses to form the optical elements 220, as described above.

In at least one embodiment, the method 900 includes a step of depositing a reflective coating layer upon the second surface of the substrate in a non-overlapping (e.g., non-obstructing) orientation relative to the plurality of optical elements (Step 914). In embodiments, the reflective coating layer 224 is deposited upon the second surface 208, such that it is adjacent to (e.g., is formed around, is located or formed proximate to, does not overlap, does not cover, does not totally or partially obscure) any of the optical elements 222. In embodiments, the reflective coating layer 224 is configured for providing at least some shielding for underlying circuitry of the device 300 from light (e.g., incident light).

Figure 11:
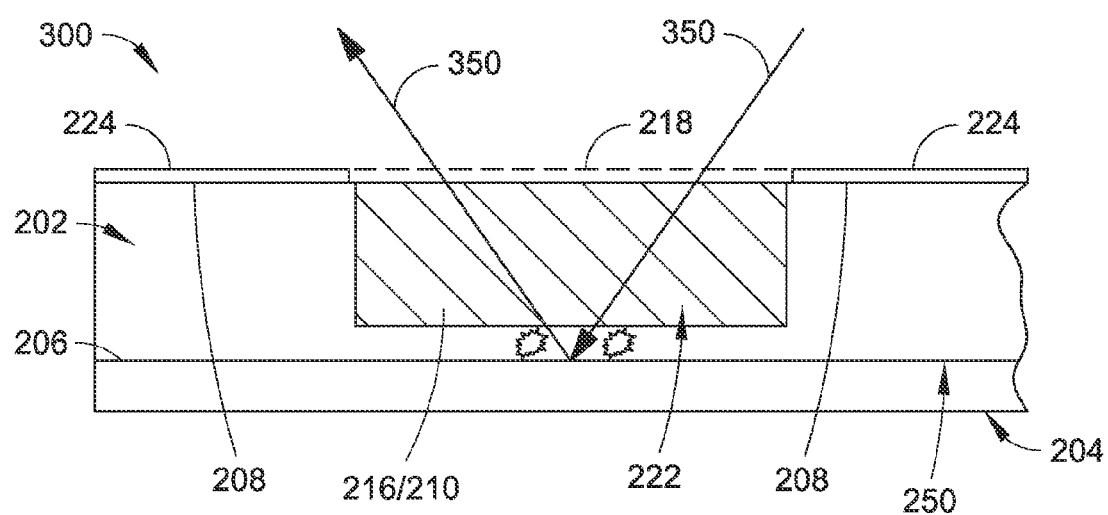
FIG. 11 is a close-up, partial cross-sectional view of the device shown in FIG. 10, the partial cross-sectional view showing the path of incident light within the device in accordance with an exemplary embodiment of the present disclosure.

FIG. 11 (FIG. 11) is a partial sectional view of the device 300 shown in FIG. 10, the partial sectional view showing the path of incident light 350 within the device 300. In embodiments, the device 300 allows for light (e.g., incident light) 350 to enter the device 300 from the second (e.g., bottom, back) surface 208 of the substrate 202, as shown in FIG. 11. In embodiments, the light 350 passes through the optical elements 222 and is received by the ALS 204. Further, the light 350 passes through the ALS 204 to the metal layer (e.g., M1 mirror) 250. In embodiments, when incident light 350 enters the metal layer (e.g., the M1 mirror) 250, the incident light creates electron-hole (e-h) pairs. In further embodiments, when incident light 350 reflects from the metal layer (e.g., the M1 mirror), the incident light creates electron-hole pairs. Thus, implementation of the mirror 250 allows for doubling of e-h pair generation and promotes increased sensitivity of the device 300.

In embodiments where the sidewalls 212 formed by the recesses 210 are sloped, the method 900 can include a step of, prior to depositing silicon dioxide into the recesses, depositing a reflective coating layer onto sidewalls formed by the recesses (Step 916). In embodiments, the additional reflective coating layer is configured for providing a further degree of protection (e.g., shielding) for underlying circuitry of the device 300 from light (e.g., incident light).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A method for fabricating a device, the method comprising:
    forming an ambient light sensor on a first surface of a substrate, the ambient light sensor configured to detect light and to provide a signal in response thereto, the substrate including a first surface and a second surface, the first surface being oriented generally opposite the second surface;
    reducing a thickness of the substrate;
    forming a plurality of recesses in a second surface of the substrate;
    depositing silicon dioxide into the plurality of recesses; and
    etching a pattern into the silicon dioxide to form a plurality of optical elements proximate to the ambient light sensor, the plurality of optical elements configured to pass light to the ambient light sensor.

2. The method for fabricating a device as claimed in claim 1, further comprising:
    depositing a reflective coating layer upon the second surface of the substrate, the reflective coating layer being located proximate to the plurality of optical elements.

3. The method for fabricating a device as claimed in claim 1, further comprising:
    prior to depositing silicon dioxide into the plurality of recesses, depositing a reflective coating layer onto sidewalls formed by the recesses.

4. The method for fabricating a device as claimed in claim 1, wherein the thickness of the substrate is reduced by applying a grinding process to the second surface of the substrate.

5. The method for fabricating a device as claimed in claim 1, wherein the plurality of recesses in the second surface of the substrate are formed via a deep reactive-ion etching (DRIE) process or a potassium hydroxide (KOH) etching process.

6. The method for fabricating a device as claimed in claim 1, wherein the pattern etched into the silicon dioxide is formed via a chemical etching process.

7. A device, comprising:
    a substrate, the substrate including a first surface and a second surface, the first surface being oriented generally opposite the second surface, the second surface defining a recess;
    an ambient light sensor, the ambient light sensor disposed on the first surface, the ambient light sensor configured to detect light and to provide a signal in response thereto; and
    an optical element disposed proximate to the ambient light sensor to pass light to the ambient light sensor, the optical element disposed in the recess.

8. The device as claimed in claim 7, wherein the substrate is a silicon wafer.

9. The device as claimed in claim 7, wherein the optical element is one of: a diffractive optical element and a lens.

10. The device as claimed in claim 9, wherein the lens is one of: a Fresnel lens, a ball lens and a micro lens.

11. The device as claimed in claim 7, further comprising:
    a reflective coating layer, the reflective coating layer being formed on the second surface, the reflective coating layer being located proximate to the optical element.

12. The device as claimed in claim 11, further comprising:
    a second reflective coating layer, the reflective coating layer being formed on the sidewall of the optical element.

13. The device as claimed in claim 11, wherein the reflective coating layer is one of: an opaque material and a metal.

14. A device, comprising:
    a substrate, the substrate including a first surface and a second surface, the first surface being oriented generally opposite the second surface, the second surface defining a recess;
    a metal layer, the metal layer being formed on the first surface;
    an ambient light sensor, the ambient light sensor being formed upon the metal layer, the ambient light sensor configured to detect light and to provide a signal in response thereto; and
    an optical element disposed proximate to the ambient light sensor to pass light to the ambient light sensor, the optical element disposed in the recess.

15. The device as claimed in claim 14, wherein the substrate is a silicon wafer.

16. The device as claimed in claim 14, wherein the optical element is one of: a diffractive optical element and a lens.

17. The device as claimed in claim 16, wherein the lens is one of: a Fresnel lens, a ball lens and a micro lens.

18. The device as claimed in claim 14, further comprising:
    a reflective coating layer, the reflective coating layer being formed on the second surface, the reflective coating layer being located proximate to the optical element.

19. The device as claimed in claim 18, further comprising:
    a second reflective coating layer, the reflective coating layer being formed on the sidewall of the optical element.

20. The device as claimed in claim 18, wherein the reflective coating layer is one of: an opaque material and a metal.

* * * * *